United States Patent [19]

Sakuyama et al.

[11] Patent Number: 5,607,609
[45] Date of Patent: Mar. 4, 1997

[54] PROCESS AND APPARATUS FOR SOLDERING ELECTRONIC COMPONENTS TO PRINTED CIRCUIT BOARD, AND ASSEMBLY OF ELECTRONIC COMPONENTS AND PRINTED CIRCUIT BOARD OBTAINED BY WAY OF SOLDERING

[75] Inventors: Seiki Sakuyama; Hiroki Uchida; Isao Watanabe, all of Kawasaki, Japan

[73] Assignee: Fujitsu Ltd., Kawasaki, Japan

[21] Appl. No.: 327,907

[22] Filed: Oct. 24, 1994

[30] Foreign Application Priority Data

| Oct. 25, 1993 | [JP] | Japan | 5-265281 |
| Oct. 26, 1993 | [JP] | Japan | 5-266690 |
| Mar. 16, 1994 | [JP] | Japan | 6-045798 |
| Jun. 17, 1994 | [JP] | Japan | 6-135926 |

[51] Int. Cl.$^6$ .............. F27B 9/06; F27D 11/02; H05B 3/20
[52] U.S. Cl. .............. 219/388; 219/411; 29/611; 392/436; 392/438
[58] Field of Search ............... 219/385, 388, 219/391, 409, 411; 373/117, 127; 338/252, 254, 256; 29/611, 613; 228/56.3, 248.1, 248.5; 148/23; 392/432, 435, 436, 438; 165/133

[56] References Cited

U.S. PATENT DOCUMENTS

| 3,836,745 | 9/1974 | Costello | 219/85 |
| 4,354,717 | 10/1982 | Rech et al. | 316/19 |
| 4,377,618 | 3/1983 | Ikeda et al. | 428/323 |
| 4,565,917 | 1/1986 | Furtek | 219/388 |
| 4,602,238 | 7/1986 | Furtek | 338/236 |
| 4,654,473 | 3/1987 | Roux et al. | 174/84 R |
| 4,654,502 | 3/1987 | Furtek | 219/85 BM |
| 4,659,906 | 4/1987 | Furtek | 219/345 |
| 4,771,929 | 9/1988 | Bahr et al. | 228/102 |
| 4,832,249 | 5/1989 | Ehler | 228/102 |
| 4,833,301 | 5/1989 | Furtek | 219/388 |
| 4,978,836 | 12/1990 | Dieudonne et al. | 219/388 |
| 4,987,290 | 1/1991 | Okuno | 392/375 |
| 5,028,760 | 7/1991 | Okuyama | 392/435 |
| 5,039,840 | 8/1991 | Boardman | 29/611 |
| 5,039,841 | 8/1991 | Kato et al. | 219/388 |
| 5,154,338 | 11/1992 | Okuno et al. | 219/388 |
| 5,225,663 | 7/1993 | Matsumura et al. | 219/390 |
| 5,262,594 | 11/1993 | Edwin et al. | 174/254 |
| 5,345,061 | 9/1994 | Chanasyk et al. | 219/388 |

FOREIGN PATENT DOCUMENTS

| EP0279011A1 | 8/1988 | European Pat. Off. . |
| 0368080A1 | 5/1990 | European Pat. Off. . |
| 8906375 U | 5/1989 | Germany . |
| 4238597A1 | 5/1994 | Germany . |
| 59-181092 | 10/1984 | Japan . |
| 61-79293 | 4/1986 | Japan . |
| 61-124084 | 6/1986 | Japan . |
| 62-31147 | 2/1987 | Japan . |
| 62-144876 | 6/1987 | Japan . |
| 62-203669 | 9/1987 | Japan . |
| 63-123593 | 10/1988 | Japan . |
| 1-254383 | 10/1989 | Japan . |
| 1254383 | 11/1989 | Japan . |
| 2-144990 | 6/1990 | Japan . |
| 3-214688 | 9/1991 | Japan . |
| 4-209671 | 7/1992 | Japan . |

Primary Examiner—Teresa J. Walberg
Assistant Examiner—J. Pelham
Attorney, Agent, or Firm—Staas & Halsey

[57] ABSTRACT

In accordance with the present invention, there is provided a soldering process comprising the steps of: providing in a furnace first and second heaters each adapted to emit infrared energy; setting a printed circuit board, which has a solder paste and an electronic component thereon, in the furnace; heating the printed circuit board with the first heater; and heating the electronic component with the second heater; wherein the first and second heaters have different radiation spectra such that infrared energy irradiated by the first heater is more absorbed by the printed circuit board and less absorbed by the electronic component than that irradiated by the second heater. The present invention also provides a soldering apparatus for use in such soldering process.

53 Claims, 8 Drawing Sheets

PROCESS AND APPARATUS FOR SOLDERING ELECTRONIC COMPONENTS TO PRINTED CIRCUIT BOARD, AND ASSEMBLY OF ELECTRONIC COMPONENTS AND PRINTED CIRCUIT BOARD OBTAINED BY WAY OF SOLDERING

BACKGROUND OF THE INVENTION

1. Field of the Invention

The present invention relates to apparatus, processes and solder pastes for soldering electronic components to a printed circuit board, and an assembly of the printed circuit board and electronic components obtained by way of soldering. More particularly, the present invention relates to a reflow soldering technology for soldering electronic components to a printed circuit board by applying a solder paste onto the printed circuit board, mounting the electronic components on the printed circuit board, and heating the printed circuit board and the electronic components.

2. Description of the Related Arts

There is conventionally known the art of electrically connecting and mechanically fixing surface mounted devices (SMDs) to a printed circuit board by way of reflow soldering in an assembly process of the surface mounted devices (SMD's) and printed circuit board.

In the reflow soldering process, SMDs are first mounted on the printed circuit board having pads on which a solder paste (also referred to as creamed solder) is preliminarily printed, with the lead terminals of the SMDs being aligned with the pads, and then the printed circuit board is introduced into a reflow apparatus (or heating apparatus).

The printed circuit board is transported within the reflow apparatus by means of a conveyor, and discharged therefrom after a predetermined time period. In the reflow apparatus, the printed circuit board is preheated to mitigate a thermal shock, then subjected to subsequent reflow heating (or main heating) to melt the solder, and after self-cooling (or forced cooling) the SMDs are bonded to the printed circuit board.

In this case, the lead terminals and bonding pads to be soldered are made of metals having high infrared reflectances, hence it is difficult to directly heat the solder paste up to a soldering temperature to achieve soldering. Therefore, heat conduction from the printed circuit board and SMDs is utilized to heat the solder paste up to the soldering temperature. Since the melting point of the solder is typically 183° C., the soldering temperature is generally set to between about 210° C. and about 230° C., which is 30° C. to 50° C. higher than the melting point of the solder.

Such a conventional soldering apparatus (reflow soldering apparatus) incorporates infrared radiation heaters in a preheating zone and in a reflow zone (main heating zone) thereof, and is so designed to adjust the temperature profiles during the transportation of the printed circuit board by controlling the outputs of the infrared radiation heaters. See Japanese Unexamined Patent Publications No. 62-203669 (1987) and No. 1-254383 (1989).

In recent years, there has been an increasing need for mounting a large number of various SMDs on a printed circuit board. Therefore, apparatus and processes capable of reliably and efficiently soldering a large number of SMDs having different heat capacities to a printed circuit board are required. Further, such apparatus and processes are also required for a large-scale printed circuit board.

However, the conventional soldering processes and apparatus present the following problems:

(1) With low settings of the outputs of infrared radiation heaters, the temperature of solder joints does not reach a soldering temperature in regions where large-scale SMDs (having a high thermal capacity) are mounted, that is, the solder joints are subjected to insufficient heating. If an attempt is made to sufficiently heat the solder joints of the large-scale SMDs by increasing the outputs of the heaters in order to avoid such insufficient heating, the printed circuit board and small-scale SMDs with low heat capacities are overheated. This will result in a breakage or cracking of wiring conductors on the printed circuit board and in a damage or characteristic degradation of the small-scale SMDs.

(2) In the case of a large-scale printed circuit board, it is difficult to uniformly heat many joint portions, hence to obtain satisfactory solder joints.

SUMMARY OF THE INVENTION

In accordance with the present invention, there is provided a soldering process comprising the steps of: providing in a furnace first and second heaters each adapted to emit infrared energy; setting a printed circuit board, which has a solder paste and an electronic component thereon, in the furnace; heating the printed circuit board with the first heater; and heating the electronic component with the second heater; wherein the first and second heaters have different radiation spectra such that infrared energy irradiated by the first heater is more absorbed by the printed circuit board and less absorbed by the electronic component than that irradiated by the second heater. The present invention also provides a soldering apparatus for use in such soldering process.

DESCRIPTION OF THE PREFERRED EMBODIMENTS

The present invention will be described in detail hereinafter.

The heating step of the present invention comprises employing a preheating and a main heating. The furnace may comprise a tunnel type furnace with a conveyor in which a preheating zone and a main heating zone (reflow heating zone) are arranged serially from an entrance to exit thereof.

A printed circuit board on which a solder paste is applied and electronic components are mounted is preheated up to a predetermined temperature (e.g., 130° C. to 160° C.) lower than the melting point of the solder at a heating rate lower than a permissible level. The temperature is then maintained for a predetermined time period (e.g., 1 minute) in the preheating step to reduce a thermal shock against the printed circuit board and electronic components.

Then, the printed circuit board and electronic components are further heated in the main heating step. Solder joints of the printed circuit board and electronic components are heated up to a soldering temperature through heat conduction from the printed circuit board and electronic components. Thus, the soldering of the solder joints can be achieved.

In the furnace first and second heaters which have different radiation spectra are disposed such that the infrared radiation emitted by the first heater is more absorbed by the printed circuit board and less absorbed by the electronic component than that emitted by the second heater.

Thus, by controlling the outputs of the first and second heaters, the temperature rises of the printed circuit board and the electronic components can be selectively controlled in the preheating step. Accordingly, the main heating step can be started in a state where the temperature difference between the printed circuit board and the electronic components is limited to a desired temperature range, thereby allowing the solder joints to be heated up to an appropriate soldering temperature without causing a large temperature difference between the printed circuit board and the electronic components even in the main heating step.

Figure 4:
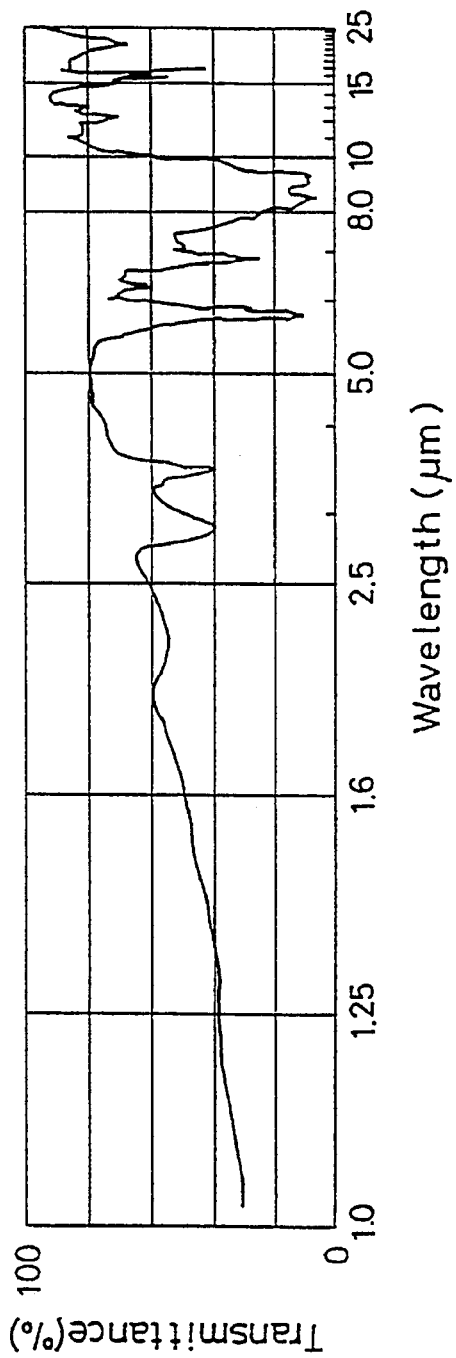
FIG. 4 is an absorption spectrum of a printed circuit board.
Figure 5:
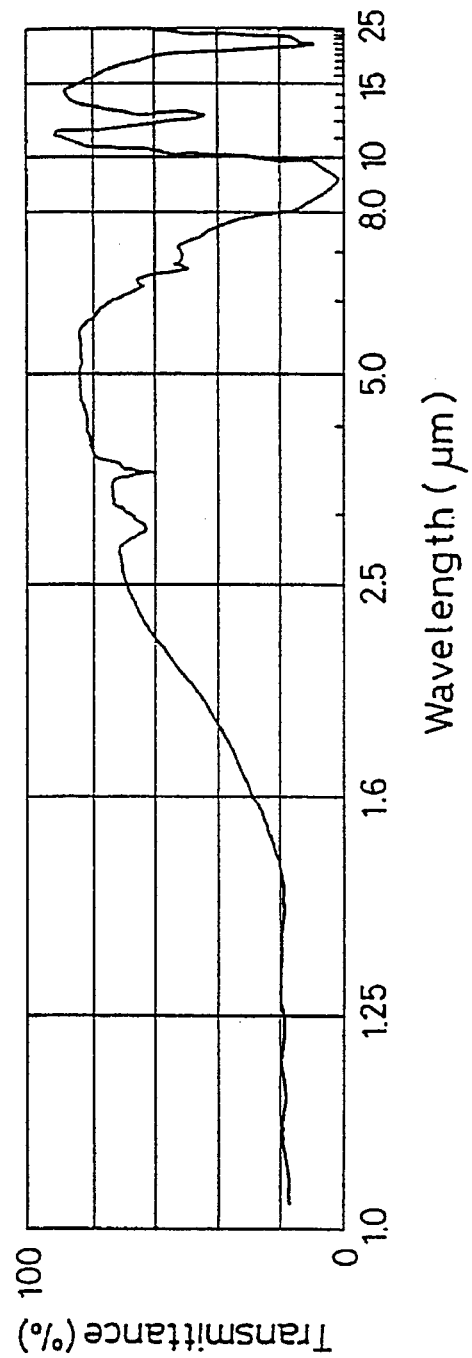
FIG. 5 is an absorption spectrum of an electronic component.

In the present invention, the subject to be soldered is a printed circuit board and electronic components (SMDs). The printed circuit board has an absorption spectrum such that infrared radiation of a wavelength of about 2.5 μm or longer is highly absorbed as shown in FIG. 4, while the electronic components have an absorption spectrum such that infrared radiation of a wavelength of less than about 2.5 μm is highly absorbed as shown in FIG. 5. As can be understood from these characteristics of the absorption spectra, the first heater is a far-infrared radiation heater which presents a radiation spectrum preferably having the maximum peak in a wavelength range of about 2.5 μm or longer, more preferably in a wavelength range of between about 5 μm and about 8 μm.

The second heater is a near-infrared radiation heater which presents a radiation spectrum preferably having the maximum peak in a wavelength range of shorter than about 2.5 μm, more preferably in a wavelength range of between about 1 μm and about 2 μm. The second heater can be, for example, a halogen lamp.

The furnace may be further provided with a third heater for the main heating step. In such a case, the third heater preferably comprises at least either one of the aforesaid far-infrared radiation heater and near-infrared radiation heater. This is because the characteristics of temperature rise of the printed circuit board and electronic components are more significantly influenced by the preheating step than by the main heating step.

Useful as the first heater is a panel heater which comprises a heat conduction plate, a heating element disposed below the heat conduction plate for heating the heat conduction plate, and an infrared radiation layer formed on the upper surface of the heat conduction plate for receiving heat from the heat conduction plate and emitting infrared radiation.

The spectrum of infrared radiation emitted by the infrared radiation layer preferably has the maximum peak in a wavelength range between about 5 μm and about 8 μm.

Preferably, the infrared radiation layer is formed of alumina and has a surface roughness of 2 μm or less. This is because the radiation spectrum is shifted to the near-infrared side if the surface roughness of the layer is greater than 2 μm.

The heat conduction plate preferably has a thermal conductivity of 50 w/m.k or greater. By employing the heat conduction plate with such a high thermal conductivity, heat can be promptly supplied to the infrared radiation plate to recover the heat removed by an object to be heated, thus obtaining a uniform temperature distribution on the surface thereof.

The heat conduction plate is made of aluminum, molybdenum, copper, graphite or aluminum nitride.

This panel heater has a buffer layer interposed between the heat conduction plate and the infrared radiation layer. The coefficient of thermal expansion (CTE) of the buffer layer is preferably in a range between that of the heat conduction plate and that of the infrared radiation layer. For example, if an aluminum heat conduction plate (CTE: 24×$10^{-6}$ $K^{-1}$) and an aluminum oxide infrared radiation layer (CTE: 5.4×$10^{-6}$ $K^{-1}$) are employed, a nichrome buffer layer (CTE: 17×$10^{-6}$ $K^{-1}$) may be interposed therebetween.

Exemplary solder pastes to be applied on the printed circuit board include a conventionally employed one having a composition shown in Table 2 which is prepared by kneading a solder powder and a flux.

A flux containing a black pigment may be specially employed to prepare the solder paste. The black pigment may be, for example, carbon black, iron oxide or a blend thereof, and is preferably added to the flux in an amount of about 1 wt % to about 5 wt % relative to the solder paste.

Where the solder paste contains the black pigment, the solder paste applied on the printed circuit board positively absorbs infrared radiation emitted by the heaters to heat up the solder joints. Therefore, the heaters are required only to supplementarily heat the printed circuit board and electronic components. Accordingly, the temperatures of the printed circuit board and electronic components are set relatively low in the main heating zone.

Where the first heater is the aforementioned panel heater comprising the heat conduction plate, the heating element disposed below the heat conduction plate for heating the heat conduction plate, and the infrared radiation layer formed on the upper surface of the heat conduction plate, the solder paste to be applied on the printed circuit board may contain a powder of the same material as that employed to form the aforesaid infrared radiation layer.

In such a case, the heaters are required only to supplementarily heat the printed circuit board and electronic components both in the preheating zone and in the main heating zone, because the solder paste itself emits infrared radiation having the same spectrum as that of the infrared radiation which the solder paste has absorbed from the first heater, thereby efficiently heating up the solder joints.

Even if only the aforesaid panel heater is employed in the soldering process, the solder joints can be heated up to an optimized temperature without overheating the printed circuit board and electronic components.

The infrared radiating powder contained in the solder paste preferably has an average particle diameter of between about 5 μm and about 50 μm, and the content thereof is preferably between about 1 wt % and about 50 wt % relative to the solder paste.

The infrared radiation layer of the panel heater may be formed of such a material as zircon, titanium oxide, chromium oxide, silicon oxide, nickel oxide or a blend thereof, as well as of alumina.

Examples of the printed circuit board for use in the present invention include a glass-fiber reinforced epoxy resin substrate and various substrates coated with a solder resist. These substrates have absorption spectra such that infrared radiation emitted by the first heater in particular is highly absorbed by the substrates.

Examples of the electronic components to be mounted on the printed circuit board include such surface mounted devices as chip components (ceramic capacitors and resistors), metal shield packages, small outline packages (SOPs) and quad flat packages (QFPs).

The conveyor for use in the present invention preferably includes support members for supporting the printed circuit board in point contact. Such support members are capable of minimizing the heat to be removed from the printed circuit board by the conveyor.

The outputs of the first, second, third heaters can be controlled, for example, by means of voltage regulators.

With reference to the attached drawings, the present invention will be hereinafter detailed by way of preferred embodiments, but not limited to the specifics thereof.

A. Soldering apparatus and soldering processes

Soldering apparatus and soldering processes according to the present invention are described by way of the following EXAMPLEs 1 to 3.

EXAMPLE 1

Figure 1:
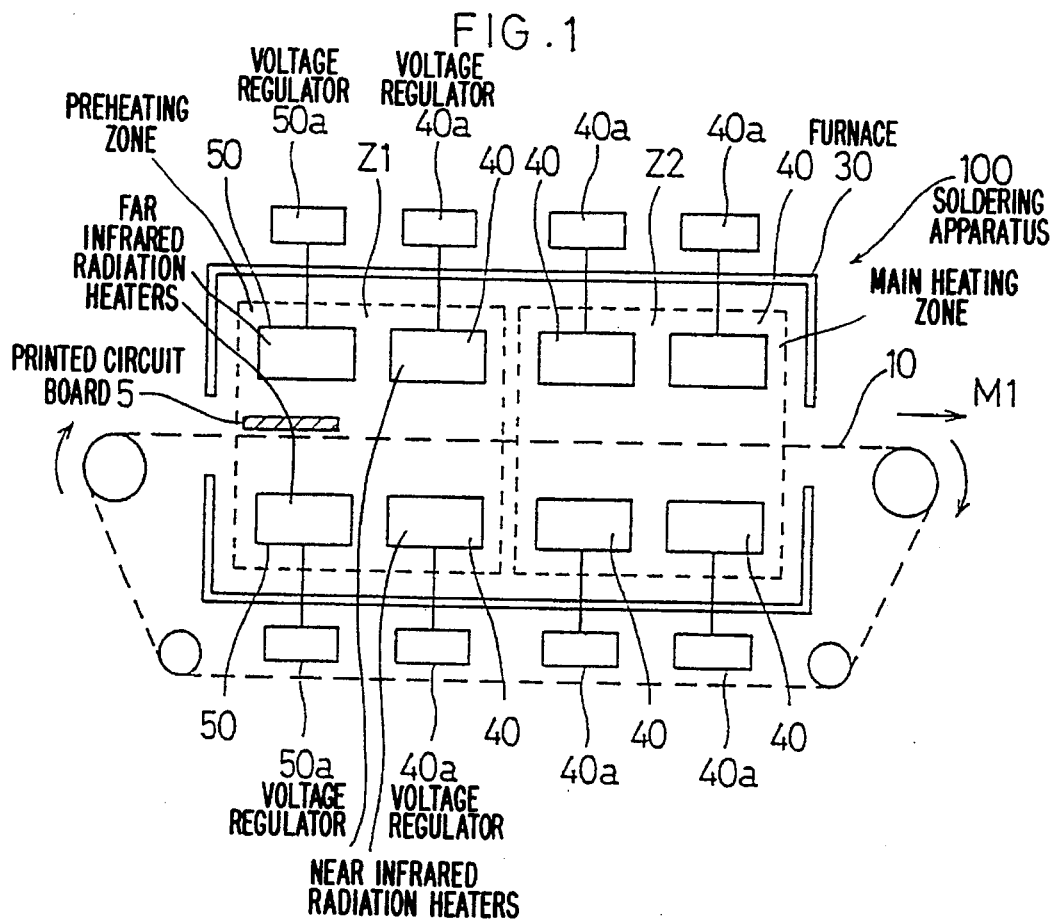
FIG. 1 is a schematic view of an apparatus which employs a process according to a first EXAMPLE 1 of the present invention for illustrating the configuration thereof.
Figure 2:
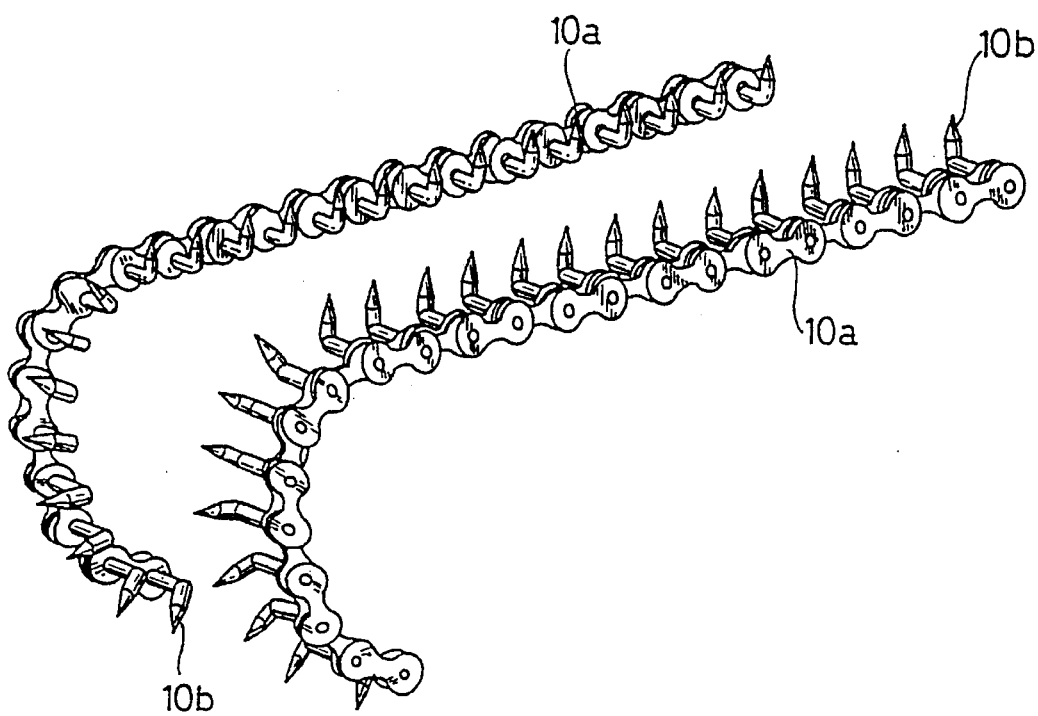
FIG. 2 is a detailed perspective view showing a component used in the apparatus of EXAMPLE 1.

FIG. 1 is a schematic view of a soldering apparatus 100 according to EXAMPLE 1 of the present invention. In FIG. 1, there is shown a furnace 30 of about 3 m long including a preheating zone Z1 and a main heating zone (reflow zone) Z2 therein and a conveyor 10. The conveyor 10 serves to carry and transport a printed circuit board 5 in the direction indicated by arrow M1, i.e., from the preheating zone Z1 toward the main heating zone Z2.

A pair of far-infrared radiation heaters 50 and three pairs of near-infrared radiation heaters 40 are disposed in a 2×4 matrix configuration at lower and upper sides of a transportation passage for transporting the printed circuit board 5, so that each pair of the same kind of the heaters face opposite to each other across the transportation passage. The pair of far-infrared radiation heaters 50 and one pair of near-infrared radiation heaters 40 are used for preheating, and the other two pairs of near-infrared radiation heaters 40 are used for main heating (reflow heating). The space between adjacent heaters along the transportation direction is about 50 mm, and the clearance between the printed circuit board 5 and each of the heaters 40 and 50 is also about 50 mm.

The input voltages of the near-infrared radiation heaters 40 and far-infrared radiation heaters 50 are respectively controlled by voltage regulators 40a and 50a.

Figure 12:
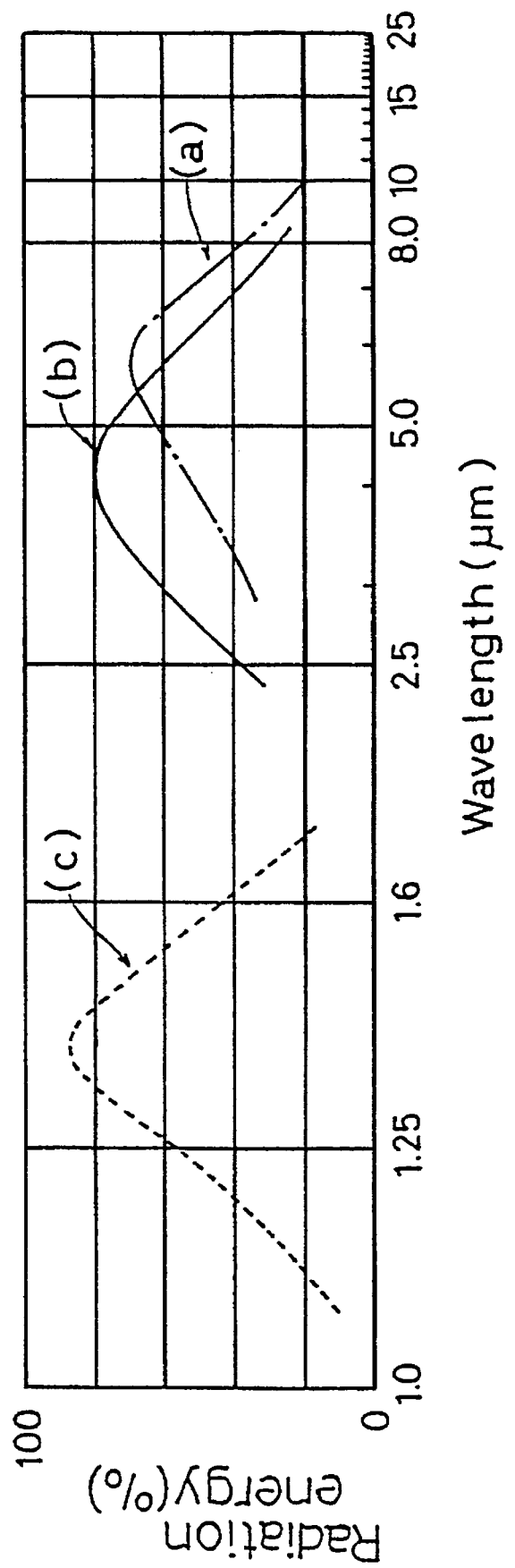
FIG. 12 shows respective radiation spectra of heaters.

The near-infrared radiation heaters 40 are panel-type halogen heaters each comprising four tubular halogen lamps (diameter: 15 mm, length: 500 mm) sealingly containing a halogen or a halogen-based compound which are disposed parallelly and spaced apart by 50 mm from each other and fixed in a rectangular panel frame. As shown in FIG. 12, the peak wavelength of radiation spectrum of each near-infrared radiation heater 40 is in a range between about 1.25 μm and about 1.6 μm.

The far-infrared radiation heaters 50 employ panel-type heaters which will be described later in the following EXAMPLEs 4 and 5. Though each far-infrared heater 50 preferably has a peak radiation wavelength of between about 5 μm and about 8 μm in terms of radiation absorption and thermal efficiency, far-infrared radiation heaters having a peak radiation wavelength of between about 3 μm and about 15 μm are applicable to the heaters 50.

To prepare the printed circuit board 5, a soldering paste is printed with use of a metal mask on pads (gold-plated pads) formed on a glass-fiber reinforced epoxy resin substrate (FR-4) on which SMDs (surface mounted devices) shown in Table 1 are mountable, and then the SMDs are mounted in predetermined positions on the substrate. The dimensions of the substrate are 250 mm×250 mm×1.6 mm. Both surfaces of the substrate except the pad portions are covered with a dry-film type solder resist.

TABLE 1

| Surface mounted devices | Number |
|---|---|
| 160 pin QFPs | 5 |
| 64 pin QFPs | 4 |
| 28 pin SOPs | 10 |
| Chip components | 40 |
| Metal seal packages | 5 |

QFP: Quad flat package
SOP: Small outline package

In EXAMPLE 1 a conventionally employed solder paste is used such as obtained by blending solder powder of an average particle diameter of 50 μm with a flux and sufficiently kneading the mixture. The composition thereof is shown in Table 2. The melting point of the solder paste is 183° C.

TABLE 2

| | | |
|---|---|---|
| Flux | Polymerized rosin | 30 g |
| | Dipropylene glycol | 49 g |
| | Butylhydroxytoluene | 0.5 g |
| | Benzotriazole | 0.5 g |
| | Silicone anti-foaming agent | 0.5 g |
| | Maleic acid | 0.5 g |
| | Hardened caster oil | 1.0 g |
| | Diethylamine hydrobromic acid | 1.0 g |
| Solder powder | Sn 63 wt % - Pb 37 wt % | 500 g |

The conveyor 10 comprises two chains 10a having L-shaped stainless support members 10b each having a diameter of 1 mm for supporting at tip portions thereof the printed circuit board 5 from the back side thereof for transportation. That is, the conveyor 10 is adapted to support the printed circuit board 5 in point contact, so that the heat removed from the printed circuit board 5 via the support members 10b by the chains 10a can be minimized.

While being transported by the conveyor 10 at a constant speed of about 0.3 m to about 0.5 m per minute, the printed circuit board 5 on which SMDs are mounted is heated by the aforesaid two kinds of heaters 40 and 50. The outputs of the respective heaters 40 and 50 are set in the following manner:

The power supply to the pair of far-infrared radiation heaters 50 in the preheating zone Z1 is set so that the surface temperature thereof (heater surface temperature) is about 500° C. The voltage applied to the pair of near-infrared radiation heaters 40 in the preheating zone Z1 is set to about 100 V (input power supply: 1.2 KW). The voltage applied to the two pairs of near-infrared radiation heaters 40 in the reflow zone Z2 for melting the solder paste is set to about 130 V (input power supply: 1.5 KW).

Under such conditions, the printed circuit board 5 was subjected to a soldering process, and the surface temperature of 160-pin QFP type SMD packages (component temperature), the temperature of lead terminals of the SMDs to be soldered to the board (joint temperature) and the surface temperature of the printed circuit board 5 were each continuously measured by means of a thermocouple.

Figure 3:
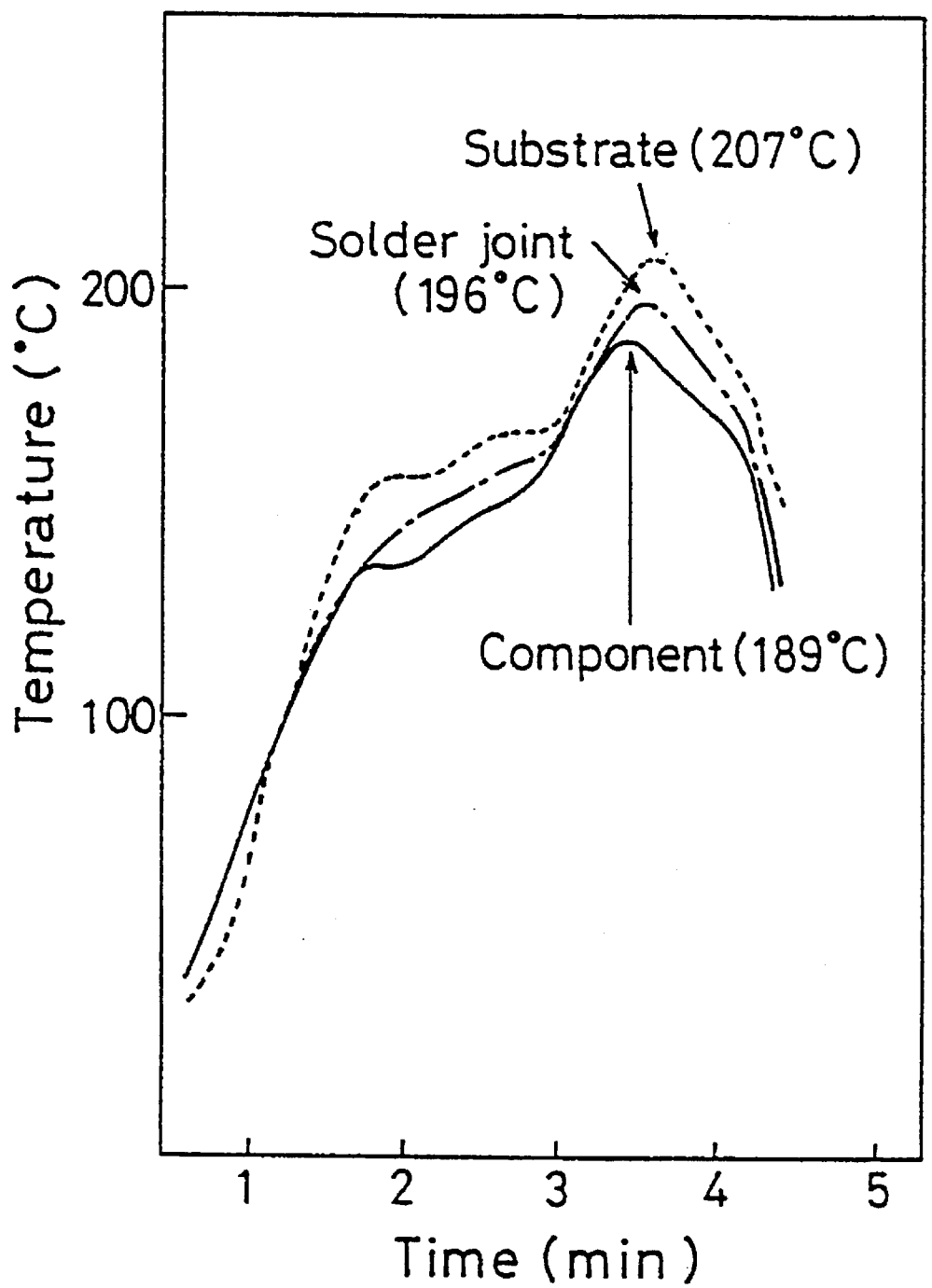
FIG. 3 is a graphical representation illustrating temperature profiles observed in the process of EXAMPLE 1.

FIG. 3 is a graphical representation of temperature profiles obtained from this measurement.

As can be understood from FIG. 3, the requirement for preheating in a soldering process of commercially available SMDs, i.e., the requirement of maintaining the SMDs at a temperature of 130° C. to 160° C. for 1 minute or more for the preheating, was satisfied. The maximum temperature of the 160-pin QFPs which were the least susceptible to temperature rise among the SMDs due to the high thermal capacity thereof was 189° C., while the maximum temperatures of the solder joints and substrate were 196° C. and 207° C., respectively. That is, the joint temperature reached an appropriate level higher than the melting point of the solder paste which ensures the melting of the solder paste, yet the difference in the observed maximum temperature between the joints and substrate was only 11 deg., and the substrate temperature was maintained to be relatively low. In addition, the substrate temperature exceeded the melting point of the solder paste earlier than the component temperature.

As proved by the temperature profiles shown in FIG. 3, a good soldering state was observed for all the SMDs in the assembly of the printed circuit board and SMDs obtained by the aforesaid soldering apparatus and soldering process, and no wicking nor other joint defects were observed.

As a reference example, four pairs of far-infrared radiation heaters 50 were employed, and disposed in a 2×4 matrix configuration in a furnace 30 shown in FIG. 1 and used in the EXAMPLE 1. A printed circuit board 5 of the same type as used in EXAMPLE 1 was subjected to a soldering process in substantially the same manner as in EXAMPLE 1. At this time, the respective outputs of the far-infrared radiation heaters 50 were variously set by means of voltage regulators 50a.

As a result, where the maximum temperature of 160-pin QFPs which were the least susceptible to temperature rise among the SMDs due to the high thermal capacity thereof was 189° C. (same as that observed in EXAMPLE 1), the maximum temperatures of the substrate and solder joints were 240° C. and 196° C., respectively, and the difference between the joint temperature and the substrate temperature was 44 deg.

As can be understood from the foregoing, in the preheating process, the far-infrared radiation heaters 50 emit infrared radiation of a wavelength which is easily absorbed by the printed circuit board, while the near-infrared radiation heaters 40 emit infrared radiation of another wavelength which is easily absorbed by the SMDs. Therefore, the temperatures of the printed circuit board and SMDs can be selectively controlled.

FIGS. 4 and 5 show the absorption spectrum of a solder resist covering the printed circuit board 5 and that of a QFP, respectively. Further in FIG. 12, curves (a) and (c) show radiation spectra of the far-infrared radiation heaters 50 and near-infrared radiation heaters 40, respectively. These radiation spectra support the effect of the aforesaid selective temperature control.

In detail, the SMDs can be quickly heated, and the heat conduction from the solder joints to the SMD bodies is decreased, compared with a conventional case where only far-infrared radiation heaters are employed for preheating. Accordingly, the solder joints of an original heating object can be sufficiently heated without heavily depending on the heat conduction from the printed circuit board 5. Therefore, the soldering process is not adversely affected even when the temperature rise of the printed circuit board 5 is suppressed. Further, the overheating of small-scale components (SOPs and chip components) can be prevented by suppressing the temperature rise of the printed circuit board 5 through the selective temperature control.

EXAMPLE 2

Figure 6:
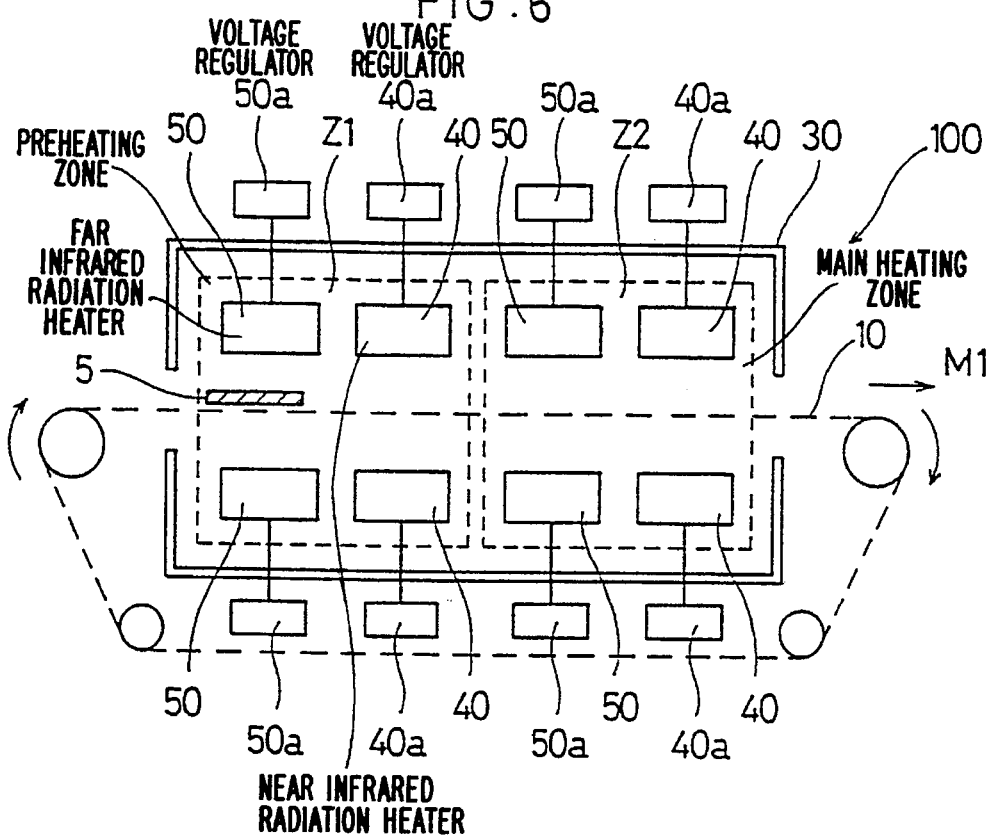
FIG. 6 is a schematic view of an apparatus used in a process according to a second EXAMPLE 2 of the present invention for illustrating the configuration thereof.

FIG. 6 is a schematic view of a soldering apparatus according to EXAMPLE 2 of the present invention.

In FIG. 6, there is shown a soldering apparatus having two pairs of near-infrared radiation heaters 40 and two pairs of far-infrared radiation heaters 50 (eight heaters in all) which are disposed in a 2×4 matrix configuration at lower and upper sides of the transportation passage of a printed circuit board 5 along a transportation direction M1 in a furnace 30. Each pair of the same kind of the heaters face opposite to each other across the transportation passage. One pair of far-infrared radiation heaters and one pair of near-infrared radiation heaters are used for preheating, and the other pairs of heaters are used for reflow heating. The other features of the soldering apparatus are substantially the same as in EXAMPLE 1.

While being transported at a constant speed of about 0.3 m to about 0.5 m per minute, the printed circuit board 5 prepared in the same manner as in EXAMPLE 1 is heated for the soldering of SMDs. The respective outputs of the heaters 40 and 50 are set as follows:

The power supply to the pair of far-infrared radiation heaters 50 in the preheating zone Z1 is set so that the surface temperature thereof is about 500 C. The voltage applied to the pair of near-infrared radiation heaters 40 in the preheating zone Z1 is set to about 100 V (input power supply: 1.2 KW). The power supply to the pair of far-infrared radiation heaters 50 in the reflow zone Z2 is set so that the surface temperature thereof is about 360° C. The voltage applied to the pair of near-infrared radiation heaters 40 in the reflow zone Z2 is set to about 130 V (input power supply: 1.5 KW).

Under such conditions, the printed circuit board 5 was subjected to a soldering process. As a result, a good soldering state was observed for all the SMDs. The maximum temperature of 160-pin QFPs which were the least susceptible to temperature rise among SMDs due to the high thermal capacity thereof was 180° C., while maximum temperatures of solder joints and substrate were 196° C. and 206° C., respectively.

EXAMPLE 3

Figure 7:
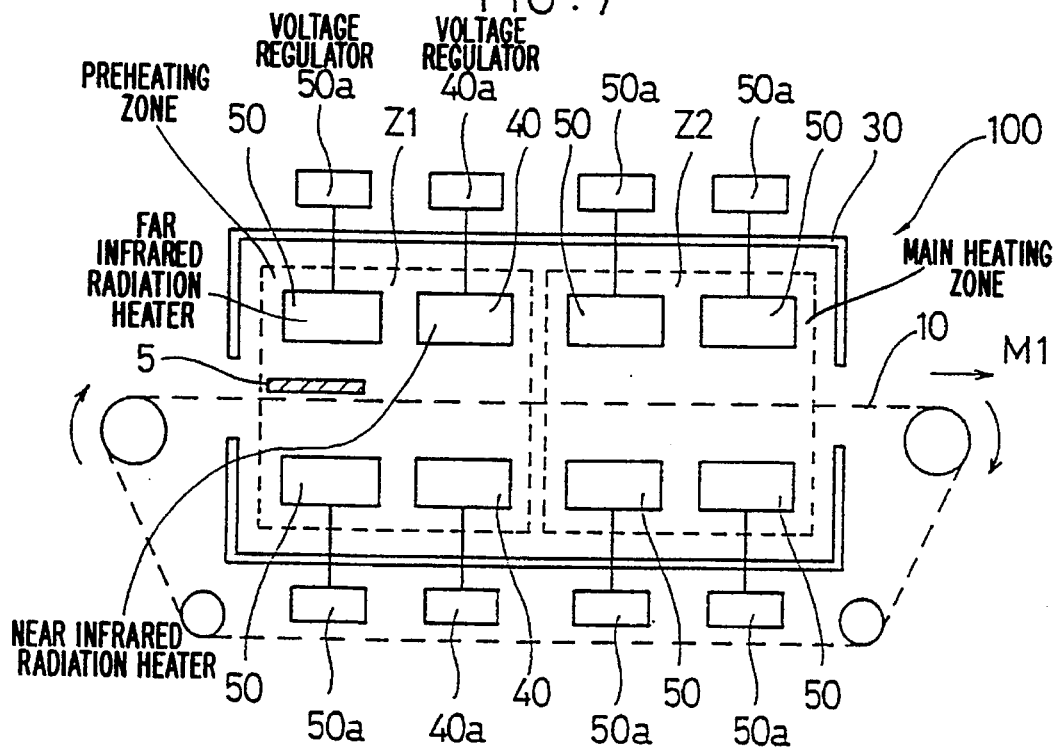
FIG. 7 is a schematic view of an apparatus used in a process according to a third EXAMPLE 3 of the present invention for illustrating the configuration thereof.

FIG. 7 is a schematic view of a soldering apparatus according to EXAMPLE 3 of the present invention. In FIG. 7, there is shown a soldering apparatus having a pair of near-infrared radiation heaters 40 and three pairs of far-infrared radiation heaters 50 (eight heaters in all) which are disposed in a 2×4 matrix configuration at lower and upper sides of the transportation passage of a printed circuit board 5 along a transportation direction M1 in a furnace 30. Each pair of the same kind of the heaters face opposite to each other across the transportation passage. One pair of far-infrared radiation heaters 50 and the pair of near-infrared radiation heaters 40 are used for preheating, and the other two pairs of far-infrared radiation heaters 50 are used for reflow heating. While being transported at a constant speed of about 0.3 m to about 0.5 m per minute, the printed circuit board 5 is heated for the soldering of SMDs in the same manner as in EXAMPLE 1. The respective outputs of the heaters 40 and 50 are set as follows:

The power supply to the pair of far-infrared radiation heaters 50 in the preheating zone Z1 is set so that the surface temperature thereof is about 500° C. The voltage applied to the pair of near-infrared radiation heaters 40 in the preheating zone Z1 is set to about 120 V (input power supply: 1.4 KW). The surface temperature of the two pairs of far-infrared radiation heaters 50 in the reflow zone Z2 is set to about 360° C.

Under such conditions, the printed circuit board 5 was subjected to a soldering process. As a result, a good soldering state was observed for all the SMDs. The maximum temperature of 160-pin QFPs which were the least susceptible to temperature rise among SMDs due to the high thermal capacity thereof was 180° C., while the maximum temperatures of solder joints and substrate were 196° C. and 207° C., respectively.

In EXAMPLE 3, though only far-infrared radiation heaters 50 are employed in the main heating zone Z2, the substrate temperature becomes higher than the component temperature. Therefore, solder wicking hardly occurs.

In accordance with the foregoing EXAMPLEs 1 to 3, the pair of far-infrared radiation heaters 50 are disposed closer to the entrance of the preheating zone Z1 than the pair of near-infrared radiation heaters 40, and are employed as an initial heating means. Therefore, the wicking phenomenon can be prevented in which the solder paste is drawn up along the lead terminals to the body side of each SMD due to the temperature of the lead terminals becoming high at an earlier stage than that of the pads.

Further, in accordance with the foregoing EXAMPLEs 1 to 3, the halogen heaters having heating elements each generating heat of a temperature higher than about 1000° C. and emitting intensive near-infrared radiation of a wavelength of 2 μm or shorter are employed as the near-infrared radiation heaters 40. Therefore, large-scale SMDs having an absorption spectrum as shown in FIG. 5 can be efficiently heated.

Still further, the alumina heaters which emit intensive far-infrared radiation of a wavelength of between about 5 μm and about 8 μm are employed as the far-infrared radiation heaters 50. Therefore, the printed circuit board 5 having an absorption spectrum as shown in FIG. 4 can be efficiently heated. On the other hand, the characteristics of temperature rise of small-scale SMDs are significantly influenced by the temperature of the substrate, because the small-scale SMDs have a low thermal capacity. The soldering process of the present invention can suppress the temperature rise of the substrate more than the conventional soldering process, thereby preventing the overheating of the small-scale SMDs.

In the foregoing EXAMPLEs 1 to 3, the number, arrangement order and arrangement interval of near-infrared radiation heaters 40 and far-infrared radiation heaters 50 in the preheating zone Z1 can be variously changed according to the application of the present invention. For example, three or more infrared radiation heaters may be provided along the transportation direction M1 in the preheating zone Z1, and two or more infrared radiation heaters may be provided along the transportation direction M1 in the main heating zone Z2.

If a hot air heating method is employed along with the infrared radiation heaters in the foregoing EXAMPLEs 1 to 3, more uniform temperature distribution can be obtained over the printed circuit board 5. Further, there may be provided a gas flow-out prevention mechanism such as a labyrinth at each end of the transportation passage, and an inert gas may be used as a heating medium which is circulated within the furnace to prevent the oxidation of the solder joints.

In accordance with EXAMPLEs 1 to 3 of the present invention, optimized temperature profiles can be readily obtained which provide a small temperature difference between the printed circuit board and the electronic components. Therefore, the overheat of the printed circuit board and the deterioration of characteristics of the electronic components can be prevented. Further, solder wicking can be prevented by heating the printed circuit board up to a temperature slightly higher than the temperature of the components. This contributes to a higher production yield of assemblies of printed circuit boards and SMDs in the soldering process.

B. Far-infrared radiation panel heaters

Far-infrared radiation panel heaters according to the present invention will be described by way of the following EXAMPLEs 4 to 9.

EXAMPLE 4

Figure 8:
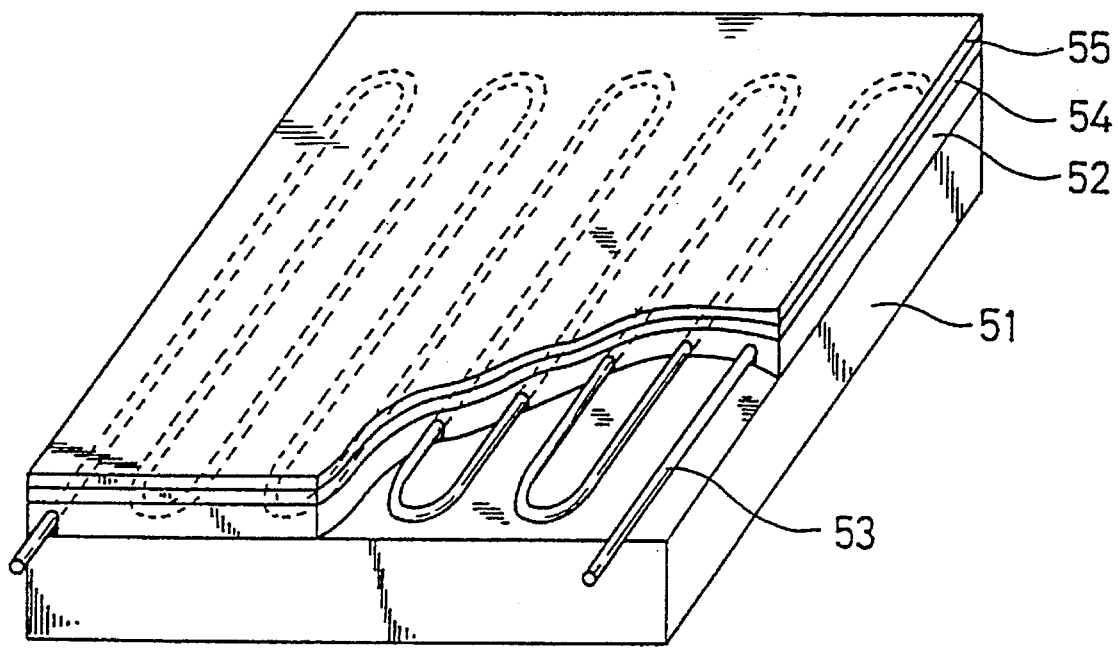
FIG. 8 is a partially cutaway perspective view of a panel heater for illustrating the configuration thereof.

FIG. 8 is a perspective view illustrating the construction of a far-infrared radiation panel heater. The heater shown in FIG. 8 includes a heat conduction plate 52 disposed on the upper surface of an insulation plate 51, a buffer layer 54 and an infrared radiation layer 55 sequentially stacked on the upper surface of the heat conduction plate 52. A sheathed heater (nichrome filament heater) 53 is inserted into a groove formed in the under face of the heat conduction plate 52, and press-fixed by the heat insulation plate 51.

This heater is fabricated in the following manner. First, the upper surface of a pure aluminum plate (50 mm×550 mm×20 mm) for industrial use is finished to a roughness of about 20 μm to about 30 μm through a sand blast treatment, and in the under face thereof is formed a groove which is adapted to receive a sheathed heater 53 to prepare a heat conduction plate 52. By thus finishing the upper surface of the heat conduction plate 52, the heat conduction plate 52 can more closely adhere to the buffer layer 54.

Then, nichrome powder is flame-sprayed onto the upper surface of the heat conduction plate 52 to form a buffer layer 54 with a thickness of 5 µm measured from the deepest portion of the surface.

In turn, aluminum oxide powder is flame-sprayed onto the buffer layer 54 to form an infrared radiation layer 55 with a thickness of about 100 µm, and the layer is subjected to a heat treatment at a temperature of about 1300° C. for one hour. Thereafter, the surface of the buffer layer 54 is finished to a roughness of 2 µm or less through a grinding treatment. The sheathed heater 53 is then inserted into the groove formed in the under face of the heat conduction plate 52, and the heat conduction plate 52 is stacked on the heat insulation plate 51 to complete the far-infrared radiation panel heater. The capacity of the heater is 200 V, 4 KW.

EXAMPLE 5

A far-infrared radiation panel heater of the structure shown in FIG. 8 is fabricated in substantially the same manner as in EXAMPLE 4, except that a molybdenum plate of the same size as the aluminum plate employed in EXAMPLE 4 is used in place of the aluminum plate to prepare a heat conduction plate 52.

EXAMPLE 6

To prepare a heat conduction plate 52 shown in FIG. 8, a groove for receiving a sheathed heater 53 is formed in the under face of a copper plate (of the same size as the aluminum plate employed in EXAMPLE 4), then the entire surface of the copper plate is plated with nickel, and the copper plate is treated in the same manner as in EXAMPLE 4. Employing the heat conduction plate 52 thus prepared, a far-infrared radiation panel heater of the structure shown in FIG. 8 is fabricated in substantially the same manner as in EXAMPLE 4. By plating the copper plate with nickel, oxidation of copper which may be caused by heating can be prevented.

EXAMPLE 7

To prepare a heat conduction plate 52 shown in FIG. 8, a groove for receiving a sheathed heater 53 is formed on the under face of a graphite plate (of the same size as the aluminum plate employed in EXAMPLE 4), then silicon carbide powder (SiC) is flame-sprayed onto the entire surface of the graphite plate, and the graphite plate is treated in the same manner as in EXAMPLE 4. Employing the heat conduction plate 52 thus prepared, a far-infrared radiation panel heater of the structure shown in FIG. 8 is fabricated in substantially the same manner as in EXAMPLE 4. By flame-spraying the silicon carbide onto the graphite plate, deterioration of graphite by oxidation which may be caused by heating can be prevented.

EXAMPLE 8

A far-infrared radiation panel heater of the structure shown in FIG. 8 is fabricated in substantially the same manner as in EXAMPLE 4, except that an aluminum nitride plate of the same size as the aluminum plate employed in EXAMPLE 4 is used in place of the aluminum plate to prepare a heat conduction plate 52.

EXAMPLE 9

A 1%-Ni steel plate of the same size as the aluminum plate employed in EXAMPLE 4 is used in place of the aluminum plate and treated in substantially the same manner as in EXAMPLE 4 to prepare a heat conduction plate 52 shown in FIG. 8. Employing the heat conduction plate 52 thus prepared, a far-infrared radiation panel heater of the structure shown in FIG. 8 is fabricated in substantially the same manner as in EXAMPLE 4.

Reference Example 1

A stainless steel plate (SUS304) of the same size as the aluminum plate employed in EXAMPLE 4 is used in place of the aluminum plate and treated in substantially the same manner as in EXAMPLE 4 to prepare a heat conduction plate 52 shown in FIG. 8. Employing the heat conduction plate 52 thus prepared, a far-infrared radiation panel heater of the structure shown in FIG. 8 is fabricated in substantially the same manner as in EXAMPLE 4.

Reference Example 2

An Mn—Mo steel plate (En16) of the same size as the aluminum plate employed in EXAMPLE 4 is used in place of the aluminum plate and treated in substantially the same manner as in EXAMPLE 4 to prepare a heat conduction plate 52 shown in FIG. 8. Employing the heat conduction plate 52 thus prepared, a far-infrared radiation panel heater of the structure shown in FIG. 8 is fabricated in substantially the same manner as in EXAMPLE 4.

Reference Example 3

A far-infrared radiation panel heater of the structure shown in FIG. 8 is fabricated in substantially the same manner as in EXAMPLE 4, except that chromium oxide powder is used in place of the aluminum oxide powder employed in EXAMPLE 4 to form an infrared radiation layer 55.

Heating test

A heating test was carried out in which a heating object was heated using each of the heaters fabricated according to EXAMPLEs 4 to 9 and REFERENCE EXAMPLEs 1 and 2.

A glass-fiber reinforced epoxy resin substrate (450 mm×450 mm×1.6 mm) coated with a solder resist was used as the heating object.

Figure 10:
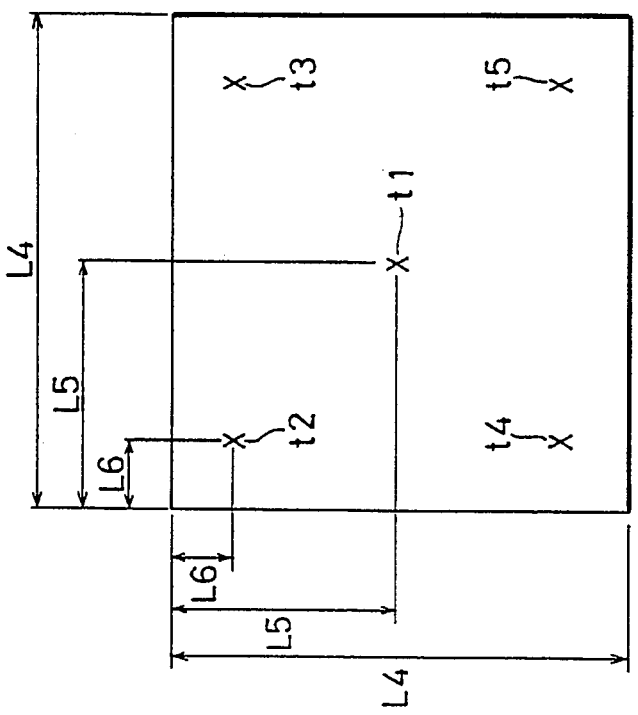
FIG. 10 is a diagram showing temperature measuring points on a panel heater.
Figure 9:
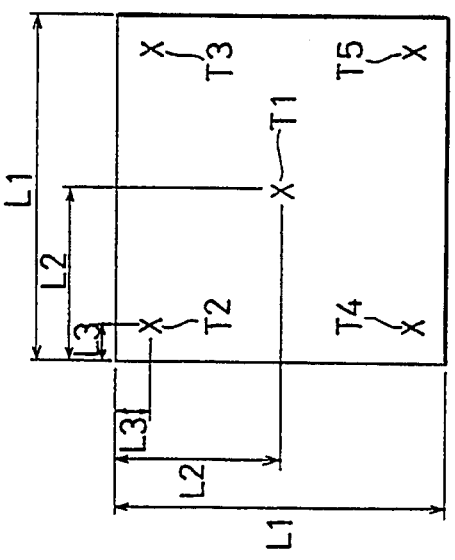
FIG. 9 is a diagram showing temperature measuring points on a printed circuit board.

Each heater was energized and heated up to saturation, so that the temperature of the central portion of the surface thereof reached 500° C. The substrate was then placed 50 mm apart from the surface of the heater. The temperature of the heated face of the substrate was measured at five measuring points T1 to T5 shown in FIG. 9 and, at the same time, the surface temperature of the heater was measured at five measuring points t1 to t5 shown in FIG. 10. In FIG. 9, the lengths L1, L2 and L3 are 450 mm, 225 mm and 10 mm, respectively. In FIG. 10, the lengths L4, L5 and L6 are 550 mm, 275 mm and 30 mm, respectively.

The measurements of the temperature of the substrate are shown in Table 3, and the measurements of the surface temperature of the heater and the thermal conductivity of materials of the heat conduction plates are shown in Table 4.

TABLE 3

| | Temperature of printed board (°C.) | | | | |
|---|---|---|---|---|---|
| | T1 | T2 | T3 | T4 | T5 |
| EXAMPLE 4 | 210 | 205 | 207 | 209 | 208 |
| EXAMPLE 5 | 210 | 204 | 207 | 209 | 206 |
| EXAMPLE 6 | 210 | 208 | 207 | 208 | 209 |
| EXAMPLE 7 | 210 | 205 | 206 | 206 | 208 |
| EXAMPLE 8 | 210 | 205 | 207 | 207 | 207 |
| EXAMPLE 9 | 210 | 197 | 196 | 199 | 198 |
| REFERENCE 1 | 210 | 190 | 185 | 189 | 188 |
| REFERENCE 2 | 210 | 194 | 190 | 193 | 195 |

TABLE 4

| | Surface temperature of heater (°C.) | | | | | Heat (W/m·k) conductivity |
|---|---|---|---|---|---|---|
| | t1 | t2 | t3 | t4 | t5 | |
| EXAMPLE 4 | 500 | 495 | 496 | 497 | 496 | 232 |
| EXAMPLE 5 | 500 | 496 | 497 | 497 | 496 | 126 |
| EXAMPLE 6 | 500 | 498 | 499 | 499 | 498 | 384 |
| EXAMPLE 7 | 500 | 495 | 496 | 497 | 496 | 139 |
| EXAMPLE 8 | 500 | 496 | 496 | 497 | 496 | 180 |
| EXAMPLE 9 | 500 | 489 | 487 | 490 | 490 | 51.2 |
| REFERENCE 1 | 500 | 470 | 468 | 471 | 469 | 16.0 |
| REFERENCE 2 | 500 | 483 | 479 | 481 | 485 | 48.2 |

As can be seen from Table 3, the temperature distribution over the substrate observed in the heating test using the heaters fabricated in EXAMPLEs 4 to 9 ranges from 198° C. to 210° C. (temperature variation is 12 deg.). On the other hand, the heaters fabricated in REFERENCE EXAMPLEs 1 and 2 exhibit relatively wide temperature distributions which range from 185° C. to 210° C. (temperature variation is 25 deg.) and from 190° C. to 210° C. (temperature variation is 20 deg.), respectively.

The temperature of the printed circuit board is preferably set to between about 195° C. and 210° C. for the reflow process in consideration of the melting point (183° C.) of a solder paste typically employed for soldering and the heat resistance of the printed circuit board and SMDs. However, the heaters fabricated in REFERENCE EXAMPLEs 1 and 2 do not satisfy this preferable condition, because the temperature variation is greater than 15 deg.

As can be understood from Tables 3 and 4, the variation in the surface temperature distribution of the heater corresponds to the variation in the temperature distribution of the substrate, and is widened as the thermal conductivity of the heat conduction plate becomes smaller. Therefore, it is desired that the thermal conductivity of the heat conduction plate be greater than 50 W/m k.

Figure 11:
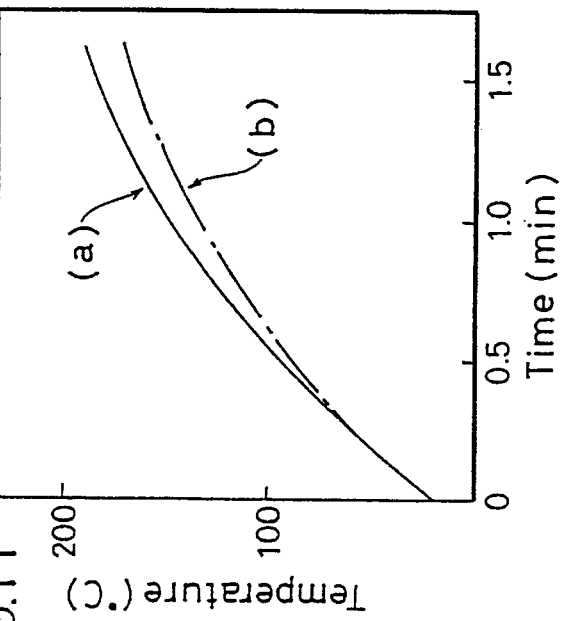
FIG. 11 is a graphical representation illustrating a change in the temperature of a printed circuit board with lapse of time.

Further, the characteristic of the radiation energy versus the wavelength of infrared radiation emitted by a panel heater is determined by the material of the infrared radiation layer. To examine this characteristic, substrates were respectively heated by the heaters fabricated in EXAMPLE 4 and REFERENCE EXAMPLE 3, and the surface temperature of each substrate was measured in the same manner as mentioned above. In FIG. 11, the changes in the temperature over elapsed time observed at the measuring point T1 of the substrates heated by the heaters of EXAMPLE 4 and REFERENCE EXAMPLE 3 are respectively illustrated by the curves (a) and (b).

Still further, it is generally known that the characteristic of the radiation energy versus the wavelength of infrared radiation emitted by a heater, i.e., radiation spectrum, is also determined by the material of the infrared radiation layer. In FIG. 12, the spectra of radiations emitted by the heaters fabricated in EXAMPLE 4 and REFERENCE EXAMPLE 3 are respectively illustrated by the curves (a) and (b).

As can be seen from FIG. 12, the peaks of the radiation energies emitted by the heater (aluminum oxide) of EXAMPLE 4 and by the heater (chromium oxide) of REFERENCE EXAMPLE 3 are observed at wavelengths of about 6 μm and about 4 μm, respectively. This makes a difference in the absorbance of radiation energy absorbed by the printed circuit board. Therefore, the heater of EXAMPLE 4 can more efficiently heat up the substrate than the heater of REFERENCE EXAMPLE 3, as can be understood from FIG. 11

C. Solder pastes

Solder pastes according to the present invention will be detailed by way of EXAMPLEs 10 and 11. The solder pastes to be described in EXAMPLEs 10 and 11 are applicable to the foregoing EXAMPLEs 1 to 3.

EXAMPLE 10

A solder paste was prepared by blending 25 g of carbon black having an average particle diameter of 50 μm and 500 g of a solder powder and 83 g of a flux of a composition shown in Table 2 and fully mixing the resultant flux blend.

A printed circuit board was prepared on which 25 208-pin quad flat packages (QFPs) were mountable via gold (Au) bonding pads patterned on the surface thereof. Surface portions of the printed circuit board other than the gold bonding pads were covered with a solder resist. The solder paste was printed on the pads formed on the printed circuit board through a metal mask.

Figure 13:
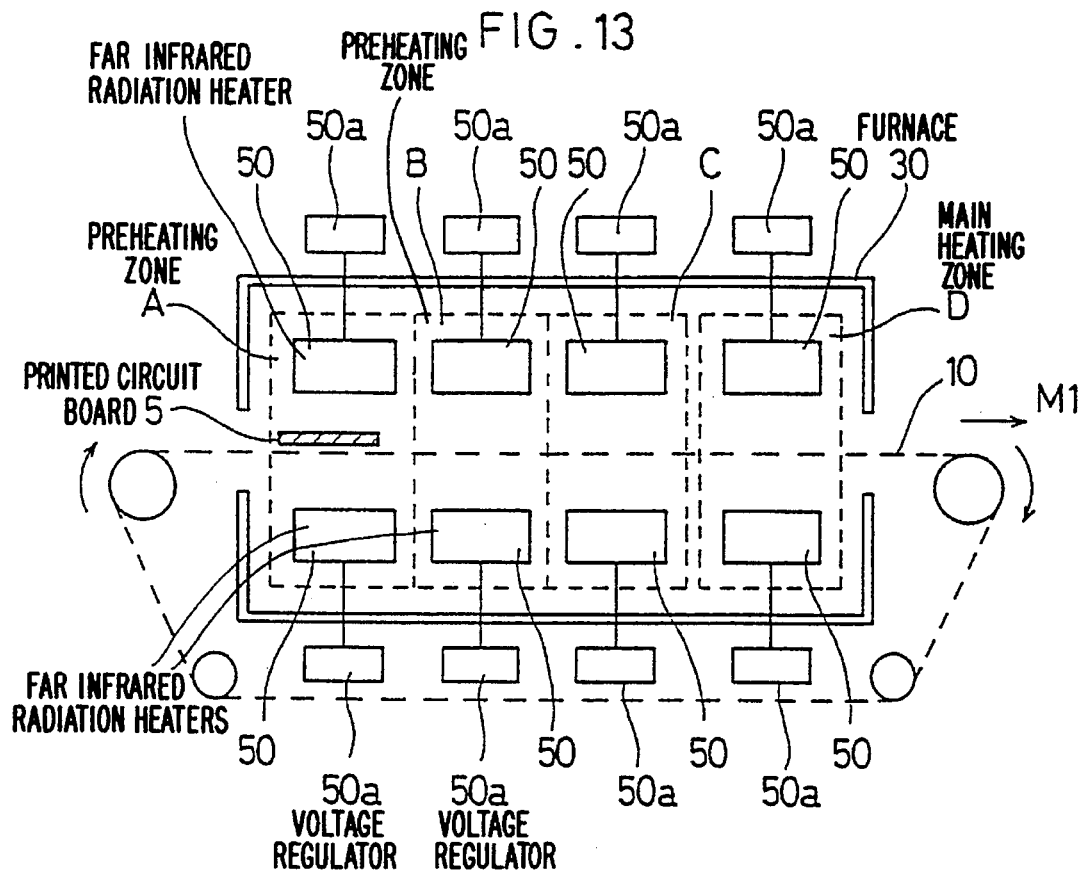
FIG. 13 is a schematic view of a soldering apparatus used in a process according to another EXAMPLE (EXAMPLE 10) 10 of the present invention.

A soldering apparatus used for the soldering in EXAMPLE 10 is shown in FIG. 13. In this soldering apparatus, the near-infrared radiation heaters 40 in the furnace 30 of the soldering apparatus shown in FIG. 1 were all replaced with far-infrared radiation heaters 50. The preheating zone Z1 was subdivided into zones A, B and C, and the main heating zone Z2 is zone D.

The surface temperatures of the heaters in the zones A, B, C and D were set to 350° C., 150° C., 150° C. and 350° C., respectively, and the printed circuit board 5 was transported by the conveyor 10 within the furnace 30 for soldering.

The temperatures of the substrate and components were measured by means of a thermocouple when the temperature of the solder paste was heated up to 220° C. during the transportation of the printed circuit board 5 in the zone D. As a result, the observed temperatures of the substrate and components were 210° C. and 200° C., respectively, which were both lower than the temperature of the solder paste. As can be seen therefrom, soldering was achieved without damaging the printed circuit board and electronic components. Subsequently, the printed circuit board was cleaned with acetone to remove the carbon black along with the flux. As a result, an excellent soldering surface was obtained.

Reference Example

A printed circuit board was prepared in substantially the same-manner as in EXAMPLE 10, except that the solder paste was replaced with a conventional solder paste of a composition shown in Table 2. The printed circuit board was then subjected to a soldering process in the soldering apparatus shown in FIG. 13 in the same manner as in EXAMPLE 10.

The substrate temperature and the component temperature measured by means of a thermocouple when the temperature of the solder paste was heated up to 220° C. during the transportation of the printed circuit board 5 in the zone D were 250° C. and 210° C., respectively. Particularly, the substrate temperature was about 30° C. higher than the target temperature (220° C.) required for soldering.

Accordingly, the temperatures of the printed circuit board and electronic components can be set relatively low when the solder paste according to EXAMPLE 10 is used. This will mitigate the damage to the printed circuit board and electronic components which may be caused by a detrimentally high temperature, thereby improving the reliability of the assembly of the printed circuit board and electronic components thus fabricated.

EXAMPLE 11

A flux of a composition shown in Table 2 was mixed with 30 g of aluminum oxide (average particle diameter: 50 μm) serving as an infrared radiation material. A solder powder (average particle diameter: 50 μm) was fully mixed with the resultant flux blend to prepare a solder paste. The solder powder comprised 63 wt % of Sn and 37 wt % of Pb, and the melting point thereof was 183° C.

A printed circuit board of such a size as to permit 25 208-pin QFPs to be mounted thereon was prepared. After the solder paste was printed on pads (gold-plated pads) formed on the printed circuit board using a metal mask, 25 QFPs were mounted in predetermined positions on the printed circuit board. Surface portions of the printed circuit board other than the pads were, of course, covered with a solder resist.

The printed circuit board on which the QFPs were mounted was introduced into the soldering apparatus shown in FIG. 13.

In this EXAMPLE, the soldering apparatus shown in FIG. 13 employed the panel heaters (see FIG. 8) fabricated according to EXAMPLE 4 as the far-infrared radiation heaters 50, the infrared radiation layer of which was formed of the same material as added to the solder paste, i.e, aluminum oxide.

The surface temperatures of the heaters in the zones A, B, C and D were set to 350° C., 150° C., 150° C. and 350° C., respectively. Under such conditions, QFPs were soldered to the printed circuit board, and the temperatures of the QFPs, printed circuit board and solder paste were measured by means of a thermocouple.

As a result, an excellent soldering state (solder joints) was obtained. The maximum temperatures of the components, substrate and solder paste observed in zone D (in reflow process) were 201° C., 209° C. and 219° C., respectively. That is, the maximum temperatures of the components and substrate were lower than that of the solder paste.

As a reference example, a solder paste free of the infrared radiation material was applied onto a printed circuit board prepared in the same manner as in EXAMPLE 11, and QFPs were soldered to the printed circuit board in substantially the same manner as in EXAMPLE 11. The composition of the solder paste used in this reference example is shown in Table 5.

TABLE 5

| Flux | Polymerized rosin | 47 g |
|---|---|---|
| | Dipropylene glycol | 49 g |
| | Butylhydroxytoluene | 0.5 g |
| | Benzotriazole | 0.5 g |
| | Silicone anti-foaming agent | 0.5 g |
| | Maleic acid | 0.5 g |
| | Hardened castor oil | 1.0 g |
| | Diethylamine hydrobromic acid | 1.0 g |
| Solder powder | Sn 63 wt % - Pb 37 wt % | 670 g |

In this reference example, the temperatures of the heaters in the zones A, B, C and D of the soldering apparatus had to be set to 370° C., 170° C., 170° C. and 370° C., respectively, so as to heat the solder paste up to 220° C. (same as that in EXAMPLE 11) to fully melt the solder paste. That is, the temperature within the furnace had to be set generally higher than that in EXAMPLE 11. When the maximum temperature of the solder paste was 220° C., the maximum component temperature was 210° C., and the maximum substrate temperature was 250° C. which was higher than that of the solder paste.

As is apparent from the above, the solder paste can be selectively heated in the reflow process by blending with the solder paste the same infrared radiation material as employed to form the infrared radiation layer 55 of the heater. This is based on Kirchhoff's law: "A body absorbs infrared radiation of a wavelength intrinsic thereto, and emits infrared radiation of the same wavelength that it has absorbed". This ensured the melting of the solder paste while suppressing a rise in the temperature of the components and substrate.

The infrared radiation material separates from the molten solder paste, and when the solder is solidified, a flux film containing the infrared radiation material appears on the surface of the solid solder layer. As required, this flux film can be easily removed through airbrushing.

Next, zircon, titanium oxide, chromium oxide, silicon oxide and nickel oxide powders were each employed in place of the alumina powder employed as an additive of the infrared radiation material to the solder paste in EXAMPLE 11, and heaters were fabricated which had substantially the same construction as shown in FIG. 8, except that infrared radiation layers thereof were formed of the same material as the aforesaid additive. QFPs were soldered to a printed circuit board in the same manner as in EXAMPLE 11 in the soldering apparatus shown in FIG. 13 comprising the aforesaid heaters. Then, the temperatures of the components, substrate and solder paste were measured for each of the cases. The results were as shown in Tables 6 and 7. As can be seen therefrom, selective heating was observed as in EXAMPLE 11.

TABLE 6

| Additives | Temp. (°C.) of component | Temp. (°C.) of substrate | Temp. (°C.) solder paste |
|---|---|---|---|
| Zircon | 200 (200) | 210 (210) | 220 (218) |
| Aluminum oxide | 201 (201) | 209 (209) | 219 (218) |
| Titanium oxide | 201 (201) | 210 (210) | 216 (216) |
| Chromium oxide | 201 (201) | 209 (209) | 218 (220) |
| Silicon oxide | 199 (199) | 206 (206) | 215 (216) |
| Nickel oxide | 197 (197) | 207 (207) | 219 (220) |
| None | 210 | 250 | 220 |

TABLE 7

| Additives | Temp. (°C.) of component | Temp. (°C.) of substrate | Temp. (°C.) solder paste |
|---|---|---|---|
| Zircon | 200 (200) | 210 (210) | 212 (228) |
| Aluminum oxide | 201 (201) | 209 (209) | 210 (228) |
| Titanium oxide | 201 (201) | 210 (210) | 211 (216) |
| Chromium oxide | 201 (201) | 209 (209) | 211 (230) |
| Silicon oxide | 199 (199) | 206 (206) | 209 (226) |
| Nickel oxide | 197 (197) | 207 (207) | 210 (230) |

In Table 6, the measurements not enclosed by parentheses indicate temperatures which were observed when the average particle diameter of the additive was 50 μm, and the measurements in parentheses indicate those observed when the average particle diameter of the additive was 5 μm. In Table 7, the measurements not enclosed by parentheses indicate temperatures which were observed when the content of the additive was 1 wt %, and the measurements in parentheses indicate those observed when the content of the additive was 50 wt %.

Figure 14:
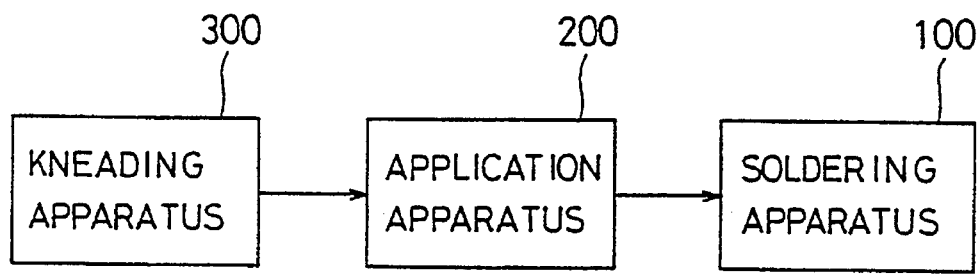
FIG. 14 is a block diagram of a soldering system according to the present invention.

The soldering apparatus (reflow apparatus) 100 described in the foregoing EXAMPLEs each constitute part of the soldering system shown in FIG. 14. The soldering system comprises a kneading apparatus 300 for kneading a mixture of a solder powder, flux and required additive to prepare a solder paste, and an application apparatus 200 for applying the solder paste onto a printed circuit board, both of which are disposed in stages precedent to the soldering apparatus 100.

The kneading apparatus 300 comprises a kneading section having kneading blades and a heating section for adjusting the viscosity of the solder paste.

The application apparatus 200 serves to print the solder paste prepared by the kneading apparatus 300 onto pads of a printed circuit board using a metal mask. The positioning of the metal mask is achieved by an image recognition positioning method or a like method. A dispenser-type apparatus may otherwise be employed as the application apparatus 200.

As has been described, the present invention enjoys the following advantages:

(1) Since the temperature of a printed circuit board and electronic components mounted thereon can be independently controlled, the temperature rise thereof and the temperature difference therebetween can be minimized to obtain reliable solder joints;

(2) By employing a panel heater with a uniform temperature distribution, a large amount of electronic components can be soldered to a large-area printed circuit board at a high yield; and (3) By blending with a solder paste a material which absorbs infrared radiation, solder joints can be appropriately heated up to a soldering temperature even if the temperatures of a printed circuit board and electronic components are set lower then those set in the conventional soldering process. Therefore, a printed circuit board and electronic components with a low heat resistance can be safely soldered.

While the present invention has been particularly shown and described with reference to the preferred embodiments, it should be understood by those skilled in the art that certain changes and modifications can be made therein without departing from the spirit and scope of the invention as defined by the following claims.

What is claimed is:

1. A soldering process comprising the steps of:
    a) providing in a furnace first and second heaters each adapted to emit infrared energy,
        the first heater comprising a first emitter most efficiently emitting in wavelengths greater than or equal to 2.5 μm, a heat conduction plate, a heating element disposed below the heat conduction plate for heating the heat conduction plate, a buffer layer formed on an upper surface of the heat conduction plate by flame-spraying, and an infrared radiation layer formed on an upper surface of the buffer layer by flame-spraying for receiving heat from the heat conduction plate through the buffer layer and emitting infrared radiation,
        the second heater including a second emitter most efficiently emitting in wavelengths less than 2.5 μm;
    b) setting a printed board, which has a solder paste and an electronic component thereon, in the furnace;
    c) heating the printed circuit board with the first heater; and
    d) heating the electronic component with the second heater, individually controlling temperatures of the printed circuit board and electronic component.

2. A soldering process as set forth in claim 1, wherein in said step a) the furnace further includes a third heater which is an infrared radiation heater presenting a radiation spectrum having a maximum peak in a wavelength range of 2.5 μm or longer.

3. A soldering process as set forth in claim 1, wherein in said step a) the first heater presents a radiation spectrum having a maximum peak in a wavelength range between about 5 μm and about 8 μm.

4. A soldering process as set forth in claim 1, wherein in said step a) the second heater presents a radiation spectrum having a maximum peak in a wavelength range about 1 μm and about 2 μm.

5. A soldering process as set forth in claim 1, wherein in said step a) the second heater comprises a halogen lamp.

6. A soldering process as set forth in claim 1, wherein said infrared radiation layer presents a radiation spectrum having a maximum peak in a wavelength range of between about 5 μm and about 8 μm.

7. A soldering process as set forth in claim 1, wherein said infrared radiation layer is formed of aluminum oxide.

8. A soldering process as set forth in claim 7, wherein said infrared radiation layer has a surface roughness of about 2 μm or less.

9. A soldering process as set forth in claim 1, wherein said heat conduction plate has a thermal conductivity of 50 w/m.k or greater.

10. A soldering process as set forth in claim 1, wherein said heat conduction plate is made of a material selected from the group consisting of aluminum, molybdenum, copper, graphite and aluminum nitride.

11. A soldering process as set forth in claim 1, wherein said first heater further comprises a buffer layer interposed between said heat conduction plate and said infrared radiation layer, said buffer layer having a coefficient of thermal expansion in a range between that of said heat conduction plate and that of said infrared radiation layer.

12. A soldering process as set forth in claim 1, wherein said furnace further comprises a conveyor for transporting the printed circuit board therethrough, said conveyor having support members for supporting said printed circuit board in point contact.

13. A soldering process as set forth in claim 1, wherein said solder paste is blended with a black pigment.

14. A soldering process as set forth in claim 13, wherein said black pigment comprises at least either one of carbon black and iron oxide.

15. A soldering process as set forth in claim 13, wherein said black pigment is added to the solder paste in an amount of about 1 wt % to about 5 wt % relative to the solder paste.

16. A soldering process comprising the steps of:
   a) providing in a furnace first and second heaters each adapted to emit infrared energy,
      the first heater comprising a first emitter most efficiently emitting in wavelengths greater than or equal to 2.5 μm, a heat conduction plate, a heating element disposed below the heat conduction plate for heating the heat conduction plate, a buffer layer formed on an upper surface of the heat conduction plate by flame-spraying, and an infrared radiation layer formed on an upper surface of the buffer layer by flame-spraying for receiving heat from the heat conduction plate through the buffer layer and emitting infrared radiation,
      the second heater including a second emitter most efficiently emitting in wavelengths less than 2.5 μm;
   b) setting a printed board, which has a solder paste and an electronic component thereon, in the furnace, said solder paste being blended with a powdered infrared radiation material the same as that of the infrared radiation layer;
   c) heating the printed circuit board with the first heater; and
   d) heating the electronic component with the second heater, individually controlling temperatures of the printed circuit board and electronic component.

17. A soldering process as set forth in claim 16, wherein said powdered infrared radiation material has an average particle diameter of about 5 μm to about 50 μm.

18. A soldering process as set forth in claim 16, wherein said powdered infrared radiation material is added to the solder paste in an amount of about 1 wt % to about 50 wt % relative to the solder paste.

19. A soldering process as set forth in claim 16, wherein said powdered infrared radiation material is selected from the group consisting of zircon, aluminum oxide, titanium oxide, chromium oxide, silicon oxide, nickel oxide, and a blend thereof.

20. A soldering apparatus, comprising:
   a furnace;
   a first heater adapted to emit infrared radiation and disposed in said furnace, said first heater comprising:
      a first emitter most efficiently emitting in wavelengths greater than or equal to 2.5 μm.
      a heat conduction plate,
      a heating element disposed below said heat conduction plate for heating said heat conduction plate,
      a buffer layer formed on an upper surface of said heat conduction plate by flame-spraying, and
      an infrared radiation layer formed on an upper surface of said buffer layer by flame-spraying for receiving heat from said conduction plate through said buffer layer and emitting infrared radiation;
   a second heater adapted to emit infrared radiation and disposed in said furnace, said second heater comprising a second emitter most efficiently emitting in wavelengths less than 2.5 μm;
   support means for supporting in said furnace a printed circuit board on an upper surface on which a solder paste is applied and an electronic component is mounted; and
   controlling means for controlling a temperature of the printed circuit board by said first heater and controlling a temperature of the electronic component by said second heater.

21. A soldering apparatus as set forth in claim 20, further comprising a third heater, which is an infrared radiation heater presenting a radiation spectrum having a maximum peak in a wavelength range of about 2.5 μm or longer.

22. A soldering apparatus as set forth in claim 20, wherein said first heater presents a radiation spectrum having a maximum peak in a wavelength range between about 5 μm and about 8 μm.

23. A soldering apparatus as set forth in claim 20, wherein said second heater presents a radiation spectrum having a maximum peak in a wavelength range between about 1 μm and about 2 μm.

24. A soldering apparatus as set forth in claim 20, wherein said second heater comprises a halogen lamp.

25. A soldering apparatus as set forth in claim 20, wherein said infrared radiation layer presents a radiation spectrum having a maximum peak in a wavelength range between about 5 μm and about 8 μm.

26. A soldering apparatus as set forth in claim 20, wherein said infrared radiation layer is formed of alumina.

27. A soldering apparatus as set forth in claim 26, wherein said infrared radiation layer has a surface roughness of about 2 μm or less.

28. A soldering apparatus as set forth in claim 20, wherein said heat conduction plate has a thermal conductivity of 50 w/m.k or greater.

29. A soldering apparatus as set forth in claim 20, wherein said heat conduction plate is made of a material selected from the group consisting of aluminum, molybdenum, copper, graphite and aluminum nitride.

30. A soldering apparatus as set forth in claim 20, wherein said first heater further comprises a buffer layer interposed between said heat conduction plate and said infrared radiation layer, said buffer layer having a coefficient of thermal expansion in a range between that of said heat conduction plate and that of said infrared radiation layer.

31. A soldering apparatus as set forth in claim 20, wherein said support means is a conveyor which has support members for supporting said printed circuit board in point contact.

32. An infrared heater, comprising:
   a heat conduction plate;
   a resistance heating element disposed below said heat conduction plate for heating said heat conduction plate;
   a buffer layer formed on an upper surface of said heat conduction plate by flame spraying; and
   an infrared radiation layer, formed on an upper surface of said buffer layer by flame-spraying, for receiving heat from said heat conduction plate through said buffer layer and emitting infrared radiation, said infrared radiation layer being formed of alumina.

33. An infrared heater as set forth in claim 32, wherein said infrared radiation layer has a surface roughness of about 2 μm or less.

34. An infrared heater as set forth in claim 32, wherein said infrared radiation layer presents a radiation spectrum having a maximum peak in a wavelength range between about 5 μm and about 8 μm.

35. An infrared heater as set forth in claim 32, wherein said heat conduction plate has a thermal conductivity of 50 w/m.k or greater.

36. An infrared heater as set forth in claim 32, wherein said heat conduction plate is made of a material selected from the group consisting of aluminum, molybdenum, copper, graphite and aluminum nitride.

37. A soldering process comprising the steps of:
   a) providing an infrared heater including an infrared radiation member made of an infrared radiation material which emits infrared radiation when heated and a heater member for heating the infrared radiation member;
   b) blending a powder of the infrared radiation material with a solder paste including a solder powder and a flux;
   c) applying the solder paste containing the powder of the infrared radiation material onto a printed circuit board;
   d) mounting an electronic component on the printed circuit board; and
   e) heating the printed circuit board having the electronic component mounted thereon by the infrared heater to solder the electronic component to the printed circuit board.

38. A soldering process as set forth in claim 37, wherein the infrared radiation material powder has an average particle diameter of about 5 μm to about 50 μm.

39. A soldering process as set forth in claim 37, wherein the infrared radiation material powder is added to the solder paste in an amount of about 1 wt % to about 50 wt % relative to the solder paste.

40. A soldering process as set forth in claim 37, wherein the infrared radiation material is selected from the group consisting of zircon, aluminum oxide, titanium oxide, chromium oxide, silicon oxide, nickel oxide, and a blend thereof.

41. An assembly comprising a printed circuit board and an electronic component, said electronic component being soldered to said printed circuit board in accordance with a soldering process as recited in claim 1.

42. An assembly comprising a printed circuit board and an electronic component, said electronic component being soldered to said printed circuit board by means of a soldering apparatus as recited in claim 20.

43. An assembly comprising a printed circuit board and an electronic component, said electronic component being soldered to said printed circuit board using an infrared heater as recited in claim 32.

44. An assembly comprising a printed circuit board and an electronic component, said electronic component being soldered to the printed circuit board in accordance with a soldering process as recited in claim 37.

45. An assembly comprising a printed circuit board and an electronic component, said electronic component being soldered to the printed circuit board using a solder paste as recited in claim 37.

46. A soldering process as set forth in claim 1, wherein the first and second emitters differ in material.

47. A soldering apparatus as set forth in claim 20, wherein said first and second emitters differ in material.

48. A solder paste for soldering by an infrared heater including an infrared radiation member made of an infrared radiation material, comprising:
   a solder paste, a flux, and a powder of the infrared radiation material.

49. A solder paste as set forth in claim 48, wherein said infrared radiation material powder has an average particle diameter of about 5 μm to about 50 μm.

50. A solder paste as set forth in claim 48, wherein said infrared radiation material powder is added to said solder paste in an amount of about 1 wt % to about 50 wt % relative to said solder paste.

51. A solder paste as set forth in claim 48, wherein said infrared radiation material is selected from the group consisting of zircon, aluminum oxide, titanium oxide, chromium oxide, silicon oxide, nickel oxide, and a blend thereof.

52. A soldering process as set forth in claim 1, wherein in step a) the furnace further includes a third heater which is an infrared radiation heater presenting a radiation spectrum having a maximum peak in a wavelength range of less than 2.5 μm.

53. A soldering apparatus as set forth in claim 20, further comprising a third heater, which is an infrared radiation heater presenting a radiation spectrum having a maximum peak in a wavelength range of less than 2.5 μm.

* * * * *

UNITED STATES PATENT AND TRADEMARK OFFICE
CERTIFICATE OF CORRECTION

PATENT NO.    :    5,607,609
DATED         :    March 4, 1997
INVENTOR(S)   :    Seiki SAKUYAMA, et al.

It is certified that error appears in the above-indentified patent and that said Letters Patent is hereby corrected as shown below:

TITLE PAGE item [56] References Cited

"5,154,338  11/1992  Okuno et al........219/388" should be --5,154,338  10/992  Okuno et al........219/388--.

Column 11

Line 4, "portion of the surface" should be --portion of the uneven surface--.

Signed and Sealed this

First Day of July, 1997

Attest:

BRUCE LEHMAN

Attesting Officer

Commissioner of Patents and Trademarks